(12) United States Patent
Chien

(10) Patent No.: US 6,366,514 B1
(45) Date of Patent: Apr. 2, 2002

(54) APPARATUS AND METHOD FOR DYNAMIC MEMORY REFRESH WITH MULTIPLE CLOCKS

(75) Inventor: Pien Chien, Taipei (TW)

(73) Assignee: Taiwan Semiconductor Manufacturing Co., LTD, Hsin-Chu (TW)

( * ) Notice: Subject to any disclaimer, the term of this patent is extended or adjusted under 35 U.S.C. 154(b) by 210 days.

(21) Appl. No.: 09/620,032

(22) Filed: Jul. 20, 2000

(30) Foreign Application Priority Data

Mar. 9, 2000 (TW) ......................... 89104225

(51) Int. Cl.[7] ............................. G06F 12/16
(52) U.S. Cl. .............. 365/222; 365/201; 713/500; 713/501; 714/721
(58) Field of Search ............... 365/185.24, 185.25, 365/189.07, 200, 201, 203, 222, 228, 193; 713/500, 501; 714/721; 711/106

(56) References Cited

U.S. PATENT DOCUMENTS

| | | | | |
|---|---|---|---|---|
| 4,594,656 A | * | 6/1986 | Moffet | 709/400 |
| 4,985,868 A | * | 1/1991 | Nakano et al. | 365/193 |
| 5,349,562 A | * | 9/1994 | Tanizaki | 365/193 |
| 5,465,367 A | * | 11/1995 | Reddy et al. | 365/222 |
| 5,566,117 A | * | 10/1996 | Okamura et al. | 365/201 |
| 5,583,823 A | * | 12/1996 | Park | 365/189.07 |
| 5,818,777 A | * | 10/1998 | Seyyedy | 365/222 |

* cited by examiner

Primary Examiner—B. James Peikari
(74) Attorney, Agent, or Firm—Darby & Darby

(57) ABSTRACT

The present invention provides a memory refresh structure having a memory array and two clock generators. The memory array has a plurality of cells grouped into original segments. The two clock generators generate two clock signals, CLK0 and CLK1. CLK0 takes responsibility for the refresh operations of the cells in the original segments to meet an original refresh time. A portion of the original segments that having at least one cell whose retention time is longer than the original refresh time are defined as first segments. CLK1 takes responsibility for the refresh operations of the cells in the first segments to make the refreshed cell meet a first refresh time shorter than the original refresh time.

22 Claims, 8 Drawing Sheets

APPARATUS AND METHOD FOR DYNAMIC MEMORY REFRESH WITH MULTIPLE CLOCKS

BACKGROUND OF THE INVENTION

1. Field of the Invention

The present invention generally relates to a dynamic memory (DRAM) refresh structure. More specifically, the present invention relates to a DRAM refresh structure with two or more clocks for controlling the refresh operations of the memory cells.

2. Description of the Related Art

One conventional DRAM cell has a metal-oxide-semiconductor transistor (MOS) and a capacitor, as show in FIG. 1. FIG. 1 illustrates a structure of a conventional DRAM array. A primary problem with DRAM is that DRAM does not store data permanently. Rather, DRAM has to be refreshed. This is because DRAM stores data as a charge on a capacitor. Over time, the charge leaks out of the capacitor. Without a refresh mechanism, data stored in a DRAM is lost. Refresh mechanisms read the contents of a DRAM memory location and restore the data, thereby refreshing the charge on the capacitor. The refresh must occur prior to the time the capacitor discharges. Data retention time is defined by the DRAM manufacture's specification. Refresh time, representing the time interval between two refresh operations for each cell, must be shorter than the data retention time in a DRAM IC.

Refresh is accomplished by accessing the data within each cell in a DRAM. DRAM modules are generally organized in a matrix having rows and columns. In order to effectively perform refresh operations without taking an inordinate amount of time by continuously reading and writing to each cell every couple of milliseconds, DRAMs are organized so that an entire row may be refreshed during a single operation. For example, in order to simultaneously refresh the cells C0 and C1, the word line Xi is selected to turn on the MOSs in the cells C0 and C1. Then, via the bit lines Bj and Bj+1, latch circuits Bj and Bj+1 read the data stored in the capacitors of the cells C0 and C1 and respectively restore the data.

FIG. 2 is a conventional memory refresh structure. Cells simultaneously refreshed are grouped as a segment, such as the segments $SO_1$–$SO_N$ shown in FIG. 2. The conventional memory refresh structure comprises a clock generator 10 and a pointer generator 12. The clock generator 10 provides a clock signal. According to the clock signal, the pointer generator 12 generates a pointer to select, in a predetermined order, one of the segments and refresh the cells in the selected segment.

The clock generator 10 and the pointer generator 12 are designed to refresh the cells within the data retention time provided by the specification. For example, if the specification of a DRAM IC shows a data retention time of 4 ms and if the number of the segments is 256, then the time interval of the clock signal should not be longer than 4 ms/256~15 us. That means the pointer generated by the pointer generator 12 may sequentially and cyclically select the segments $SO_1$–$SO_{256}$ with a time step of 15 us to repetitively refresh the cells with a refresh time of 4 ms. Therefore, the data stored in the cells can be kept.

However, cells will sometimes fail to keep data longer than the shortest discharge time defined in the specification, thereby causing the IC to fail. One way to prevent IC failure is by Presetting redundant cells to replace failed cells. However, if the number of failed cells is greater than that of redundant cells and the IC has no further repair structure, the IC will definitely fail.

FIG. 3 illustrates a testing result of a 16 Mbit DRAM IC. The horizontal coordinate represents the varied refresh time, and the vertical coordinate represents the total number of bits with lost data. The frequency of the clock signal can be controlled by signals from an external tester to vary the refresh time for the cells. Suppose the specification defines a data retention time of 4 ms. As shown in FIG. 3, some of the cells still lose the stored data and cause IC failure.

As the technology has progressed, the total number of the cells in an IC has become as large as several million. It is wasteful to discard a DRAM IC just because few cells fail among such a large amount of cells. More specifically, it is uneconomical to abandon a logical IC of embedded DRAM having a functional periphery circuit because a few failed cells are found inside.

SUMMARY OF THE INVENTION

Therefore, an object of the present invention is to provide a novel refresh structure that prevents IC failure. The refresh structure provided by the present invention can utilize cells that would normally be classified as failed in the prior art.

The present invention achieves the above-indicated objects by providing a memory refresh structure. The memory refresh structure has an original clock generator, a first clock generator, a memory array, an original segment pointer generator, and a first segment pointer generator. The original clock generator periodically generates an original clock signal. The first clock generator periodically generates a first clock signal. The memory array is composed by a plurality of memory cells, which are grouped into a plurality of original memory segments. According to the original clock signal, the original segment pointer generator generates an original pointer to cyclically select, in a predetermined order, one of the original memory segments and trigger refresh operations for the memory cells in the selected original memory segment. The first segment pointer generator one-to-one tags a portion of the original memory segments as first memory segments. According to the first clock signal, the first segment pointer further generates a first pointer to cyclically select, in a predetermined order, one of the first memory segments, and trigger refresh operations for the memory cells in the selected first memory segment. An original refresh time, defined as the time interval between two refresh operations for each cell in the original memory segments, is longer than a first refresh time, defined as the time interval between two refresh operations for each cell in the first memory segments.

The major advantage of the present invention that cells in the first memory segments, which would have been defined as failures in the prior art, are utilizable, thereby improving the IC yield rate.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

The spirit of the present invention is providing at least two clock signals for the refresh operations of the memory cells, wherein the clock signals induce different refresh times. In order to distinguish the clock signals from each other, the clock signal similar to that of the prior art is represented by an original clock signal CLK0 and the additional clock signal is represented by a first clock signal CLK1. CLK0 and CLK1 are generated by an original clock signal generator and a first clock signal generator, respectively.

A 16 mega-bit DRAM IC is used as an embodiment of the present invention. However, the present invention is not constrained in application to DRAM products.

Figure 1:
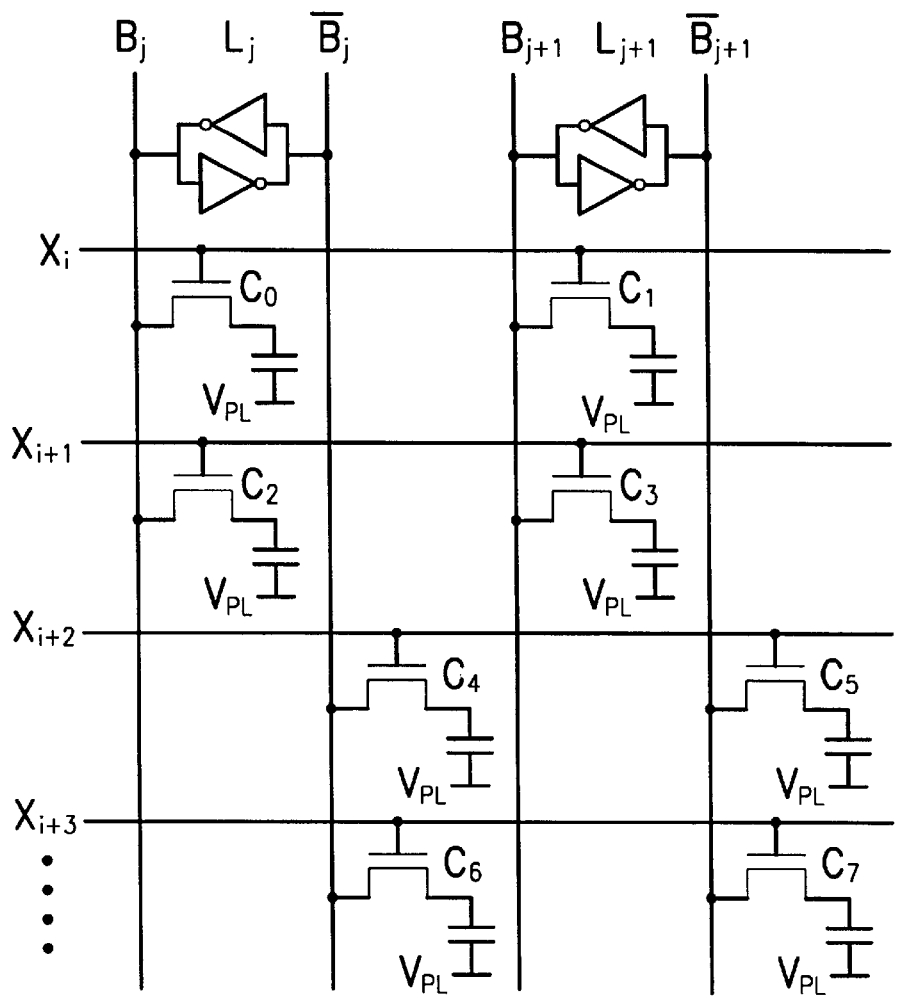
FIG. 1 illustrates a structure of a conventional DRAM array.
Figure 2:
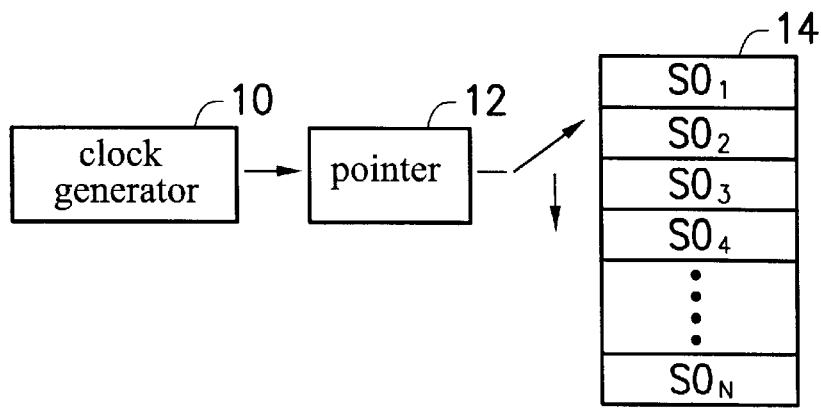
FIG. 2 is a conventional memory refresh structure.
Figure 3:
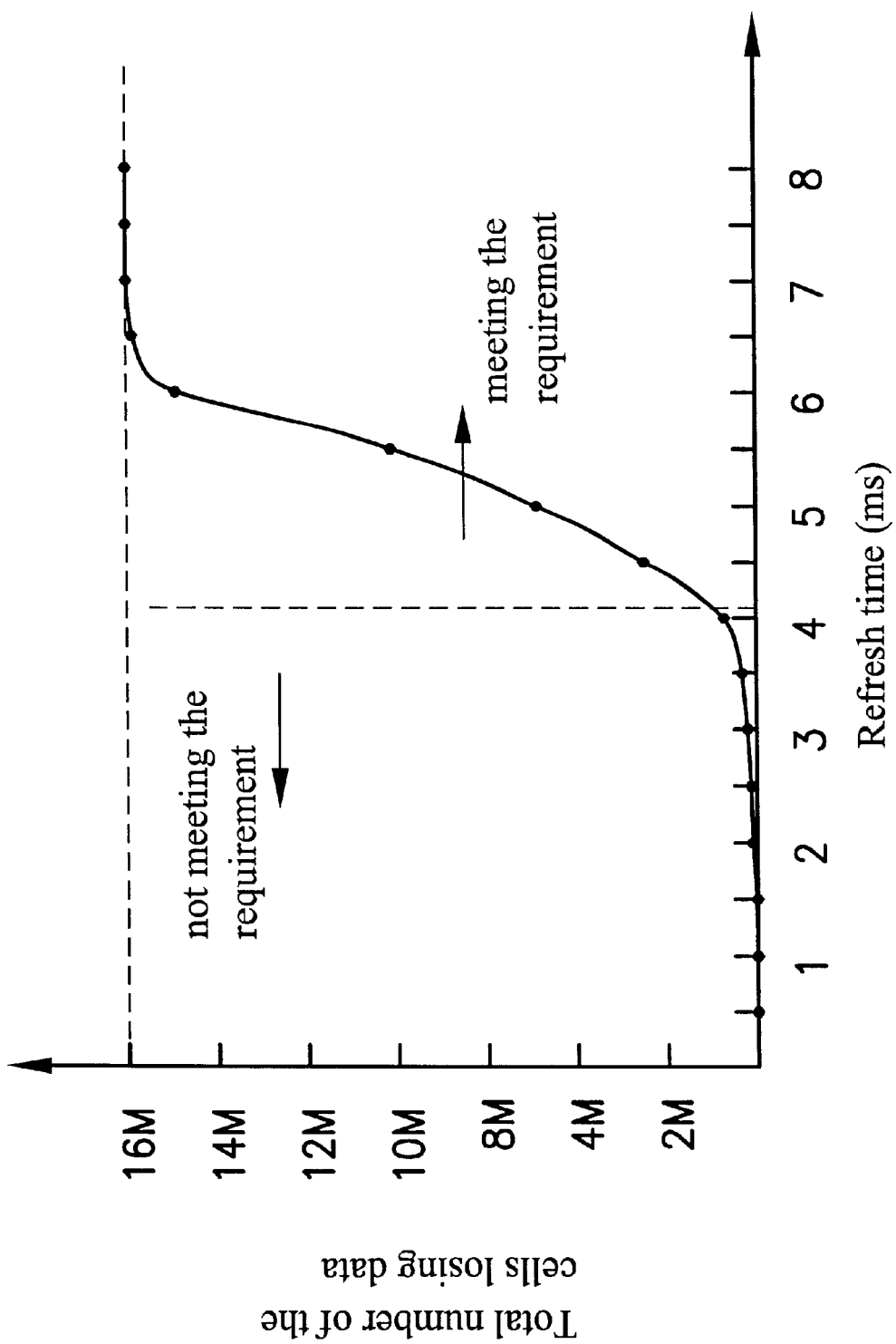
FIG. 3 illustrates a testing result of a 16 Mbit DRAM IC.
Figure 4:
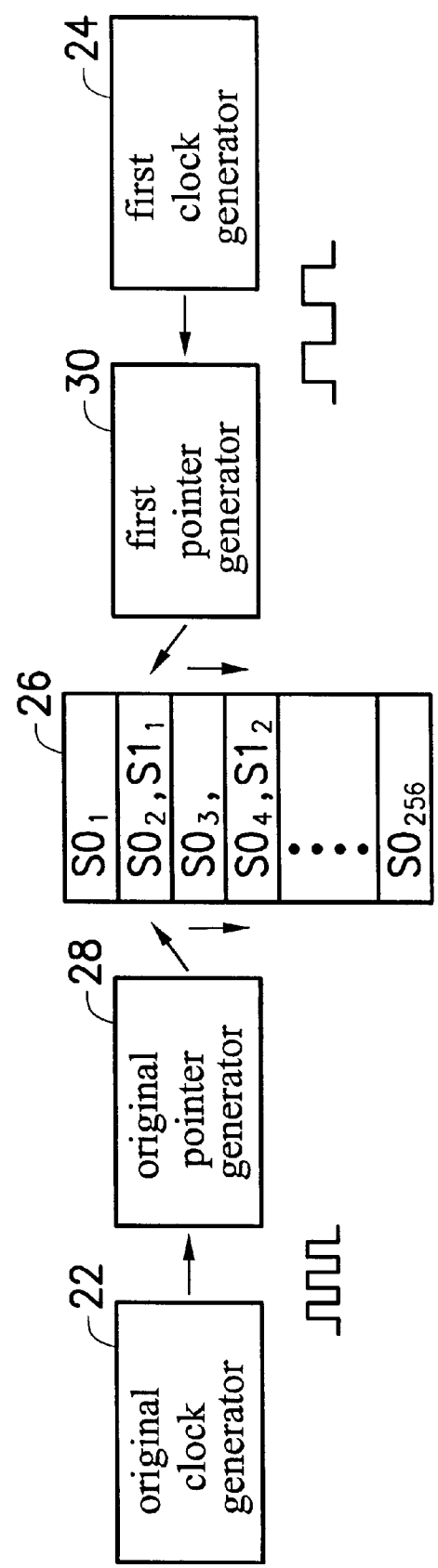
FIG. 4 illustrates a schematic diagram of a memory refresh structure according to the present invention.

FIG. 4 illustrates a schematic diagram of a memory refresh structure according to the present invention. The memory refresh structure comprises an original clock generator 22, a first clock generator 24, a memory array 26, an original pointer generator 28 and a programmable first pointer generator 30. The memory array 26 has 16 mega-bit DRAM cells, which are grouped into 256 original memory segments, such as $SO_1$–$SO_{256}$ shown in FIG. 4.

The original clock generator 22 generates an original clock signal CLK0 to trigger the original pointer generator 28 generating an original pointer. The original pointer sequentially and cyclically selects one of the original memory segments ($SO_1$–$SO_{256}$) to trigger the refresh operations therein. The combination of the original clock generator 22 and the original pointer generator 28 refreshes memory cells in $SO_1$–$SO_{256}$ to meet an original retention time $T_{retention0}$. For example, set $T_{retention0}$ equal to 4 ms. The time interval of CLK0 should not be longer than 4 ms/256~15 us. That means, the original pointer generated by the original pointer generator 28 can sequentially and cyclically select the segments $SO_1$–$SO_{256}$ with a time step of 15 us to repetitively refresh the cells within a refresh time of 4 ms.

The first clock generator 24 generates a first clock signal CLK1 to trigger the first pointer generator 30 to generate a first pointer. Furthermore, the first pointer generator 30 is programmable to one-to-one tag a portion of the original memory segments ($SO_1$–$SO_{256}$) as first memory segments ($SI_1$~$SI_m$). The first pointer sequentially and cyclically selects one of the first memory segments ($SI_1$–$SI_m$) to trigger the refreshing operations of the cells therein. Thus, the memory cells in the first memory segments are refreshed to meet a first data retention time $T_{retention1}$. $T_{retention1}$ is smaller than $T_{retention0}$.

For example, during testing of a fabricated 16 M DRAM IC, eight original memory segments (SO2,SO4 . . . ) are determined to have memory cells able to keep the stored data over 0.5 ms, i.e. $T_{retention1}$, but unable to keep the stored data over 4 ms, i.e. $T_{retention0}$. Therefore, the testing tool can program the first pointer generator 30 to define the retrieved original memory segments (SO2,SO4 . . . ) as first memory segments $SI_1$–$SI_8$. The first clock generator 24 is then enabled to generate the first clock with a cycle time no longer than 56 us(~0.5 ms/8). The first pointer generated by the first pointer generator 24 can sequentially and cyclically select the segments $SI_1$–$SI_8$ with a time step of 56 us to repetitively refresh the cells therein within a refresh time of 0.5 ms.

Figure 5:
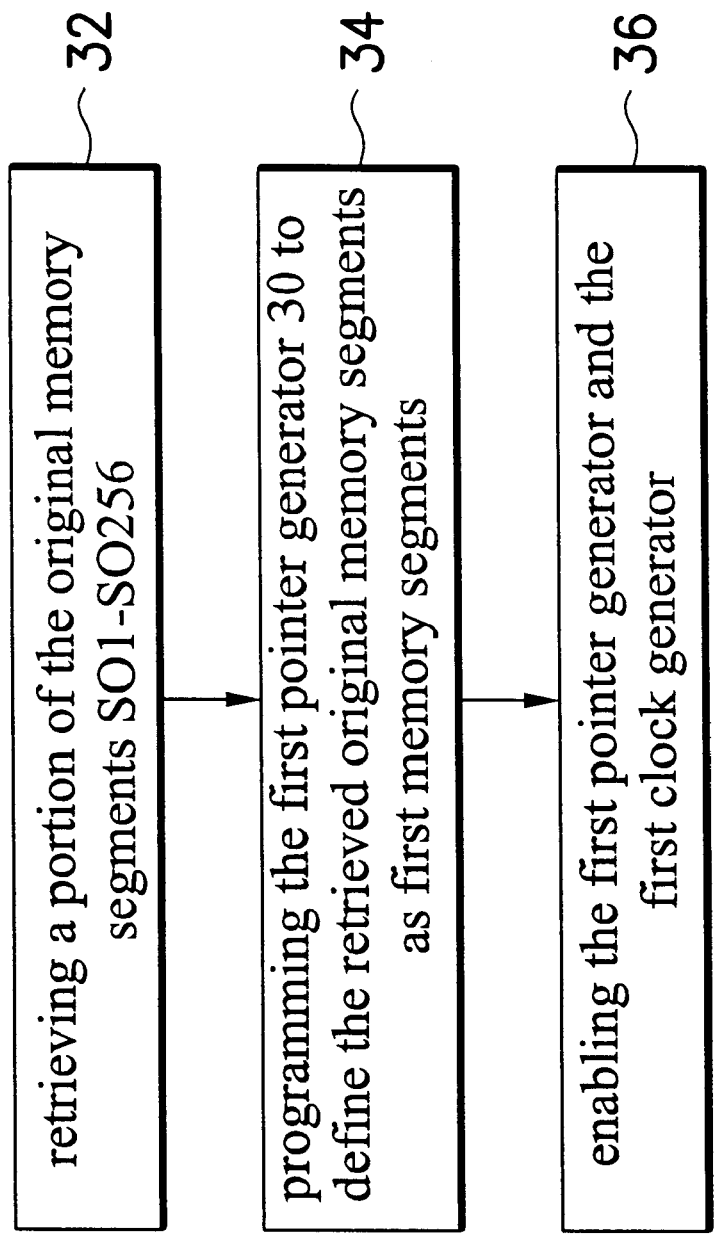
FIG. 5 illustrates the memory test method according the present invention.

FIG. 5 illustrates the memory test method according the present invention. Given the aforementioned memory refresh structure, the memory test method comprises the following steps. The first step 32 is retrieving a portion of the original memory segments $SO_1$–$SO_{256}$. Each of the retrieved original memory segments has at least one cell whose data retention time is longer than the first data retention time $T_{retention1}$ but shorter than an original data retention time $T_{retention0}$. The second step 34 is programming the first pointer generator 30 to define the retrieved original memory segments as first memory segments which can be selected by the first pointer generator 30. The third step 36 is enabling the first pointer generator 30 and the first clock generator 24 to be responsible for the refresh operations of the cells in the first memory segments.

Figure 6:
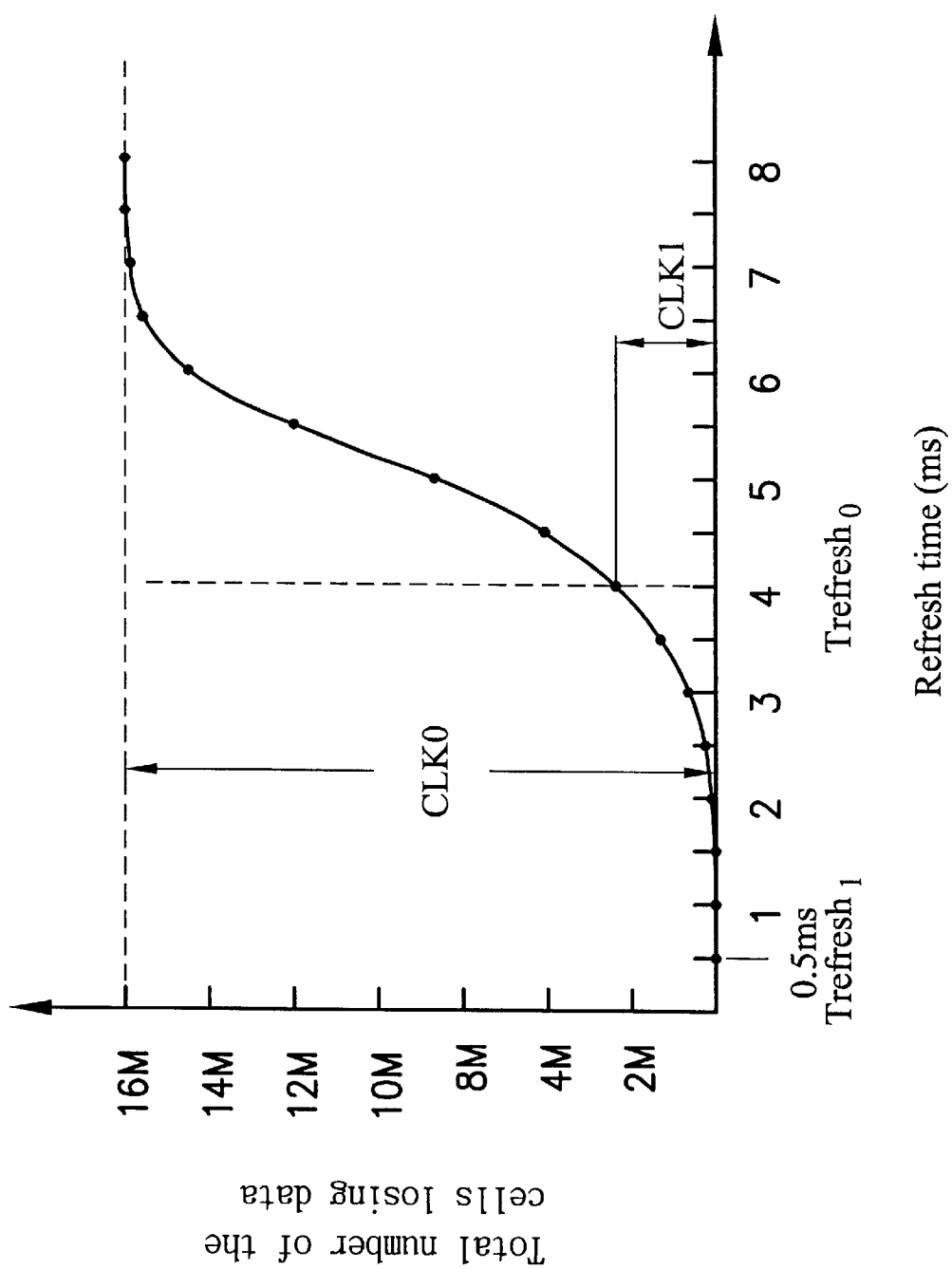
FIG. 6 illustrates a testing result of a 16 Mbit DRAM IC utilizing the present invention.

FIG. 6 illustrates a testing result of a 16 Mbit DRAM IC utilizing of the present invention. The testing result shows that all the cells have data retention times more than 0.5 ms, i.e. Trefresh1, and very few of the cells have data retention times less than 4 ms, i.e. $T_{retention0}$. CLK0 generated by the original clock generator can take responsibility for the refresh operations of the cells whose data retention time is longer than 4 ms, as taught in the prior art. As for the cells whose data retention times are between $T_{retention0}$ and $T_{retention1}$, CLK1 can take responsibility to refresh them before the stored data is lost. Thus the 16 Mbit DRAM IC, which would have otherwise been a failure in the prior art, is functional.

Figure 7:
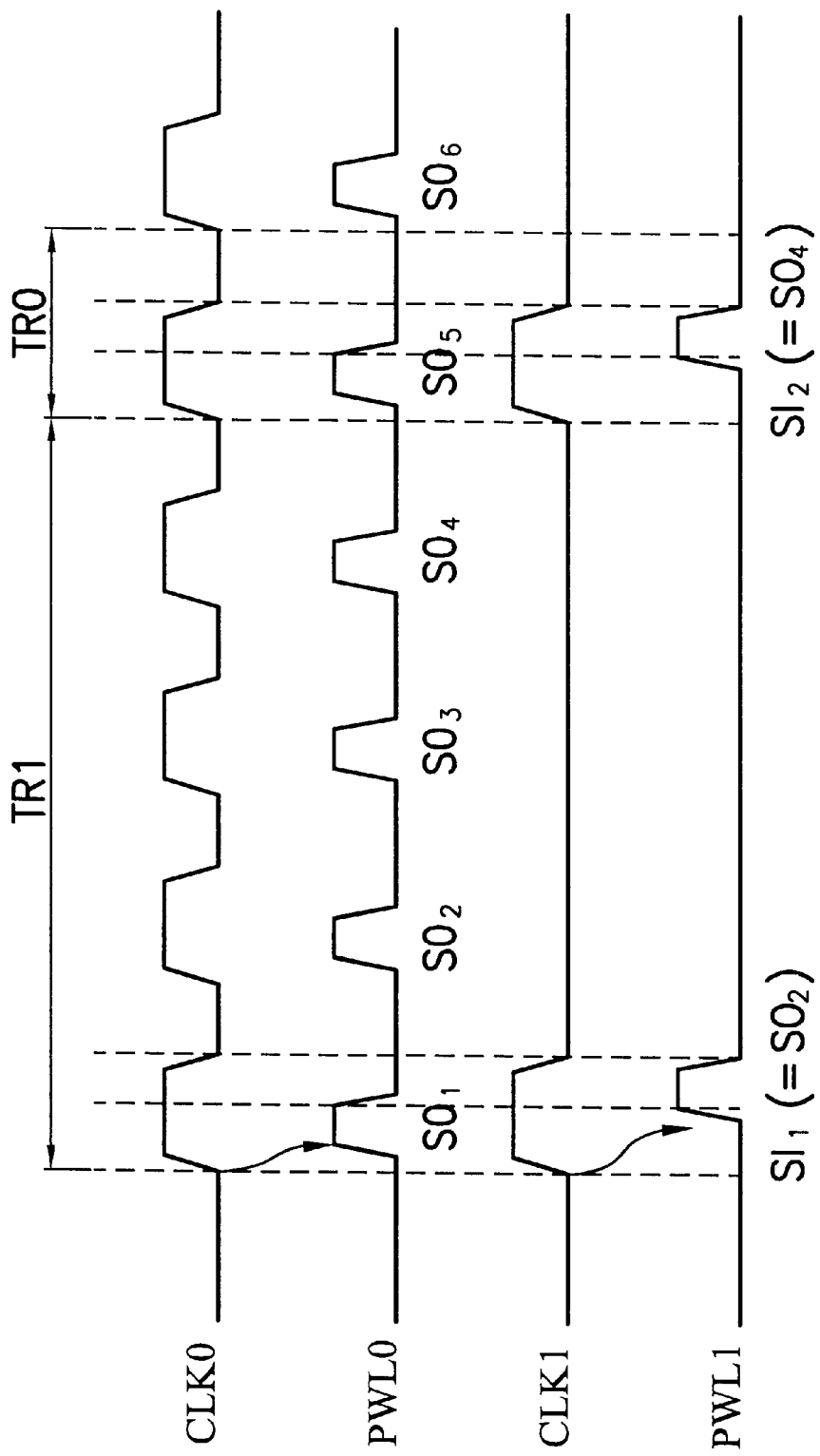
FIG. 7 is a timing diagram according to the present invention.

In order to prevent conflict between the refreshing operations triggered by CLK0 and the refreshing operations triggered by CLK1, the refreshing operations triggered by CLK0 must not be simultaneous with those triggered by CLK1. FIG. 7 is a timing diagram according to the present invention. The signals in FIG. 7, from top to bottom, are CLK0, original pulsed word line signal (PWL0), CLK1, and first pulsed word line signal (PWL1). When PWL0/PWL1 is at high level, the fresh operations of the cells in the original/first memory segments are activated. PWL0 is triggered to rise due to the rising edge of CLK0, and fall to a low level after a specific time interval. With a time step of TR0, PWL0 sequentially triggers the refresh operation of the cells in the original memory segments $SO_1$–$SO_{256}$. TR1 is 4 times TR0. In order to avoid conflict, PWL1 is triggered to rise due to the falling edge of PWL0 when CLK1 is at a high level, and fall to a low level after another specific time interval. With a time step of TR1, PWL1 sequentially triggers the refresh operation of the cells in the first memory segments $SI_1$–$SI_8$, i.e. $SO_2$ and $SO_4$, etc. PWL0 and PWL1 are never at the high level simultaneously, thus signals conflict will never occur.

Figure 8:
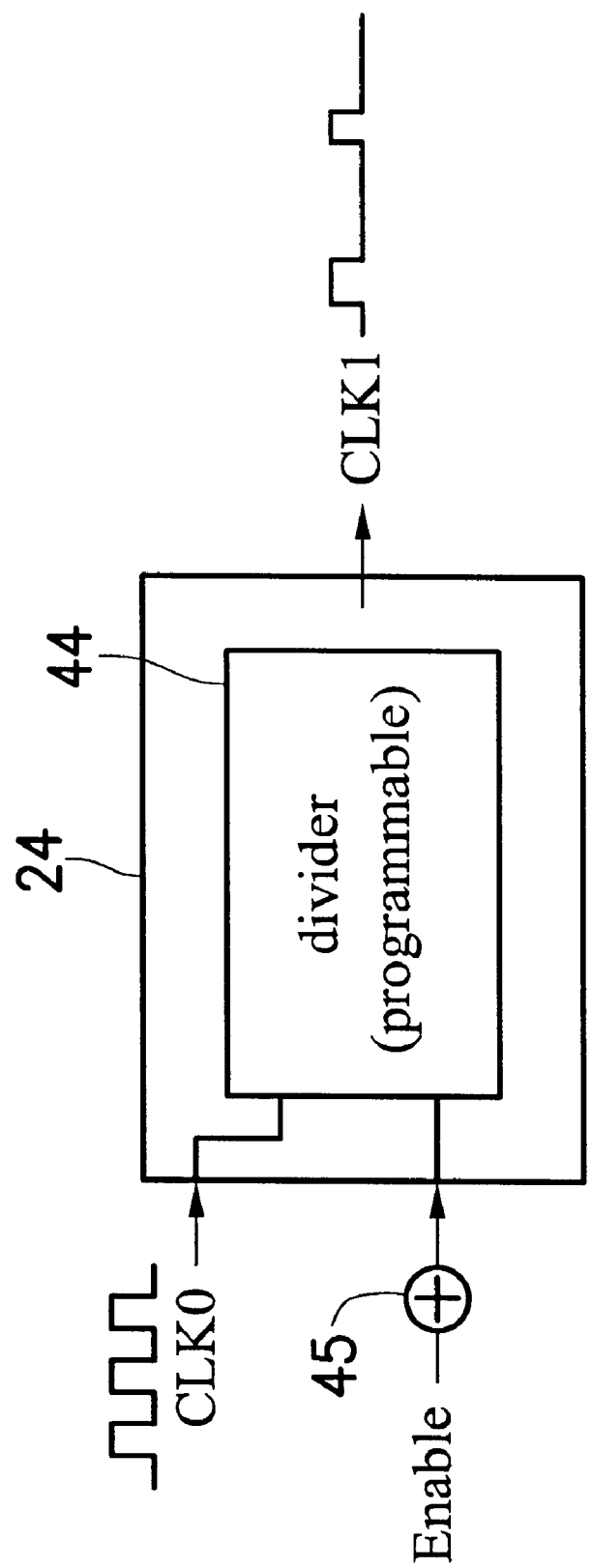
FIG. 8 is a diagram of the first clock generator in FIG. 4.

The time period of CLK0 is typically shorter than that of CLK1. Therefore, a divider can be employed to divide the frequency of CLK0 by a division rate to generate CLK1. FIG. 8 is a diagram of the first clock generator in FIG. 4. The first clock generator 24 comprises a programmable divider 44, which decides the division rate needed. There is also a fuse 45 to determine whether or not the programmable divider 44 is enabled. If all the cells in the memory array meet the requirement of $T_{retention0}$, than the first clock signal is not necessary and the fuse 45 can be kept unchanged to disable the programmable divider 44. If some of the cells in the memory array can't meet the requirement of $T_{retention0}$, the fuse 45 can be burned away to enable the programmable divider 44 and the first segment pointer generator 30.

Figure 9A:
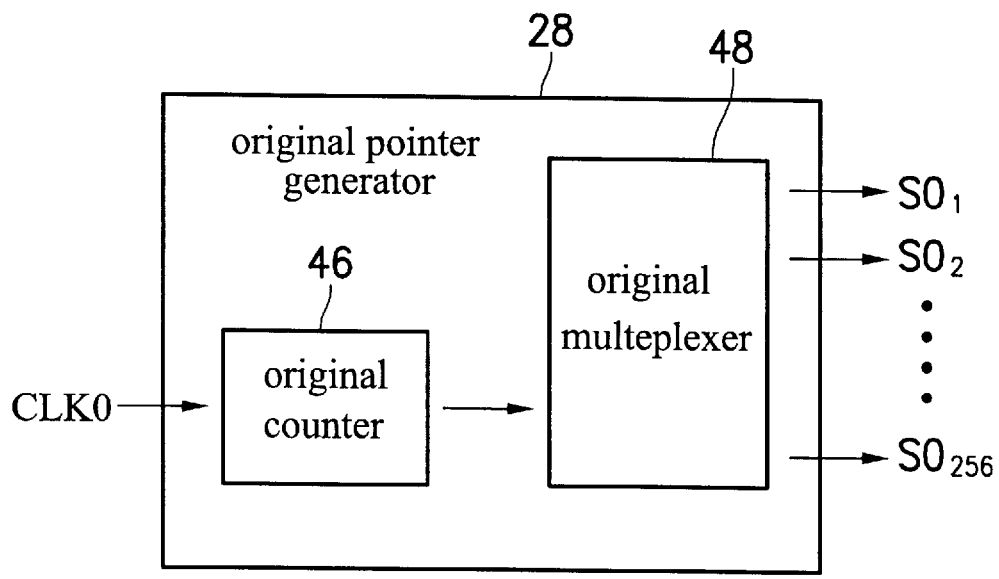
FIGS. 9A and 9B are the diagrams of the original pointer generator and the first pointer generator in FIG. 4, respectively.
Figure 9B:
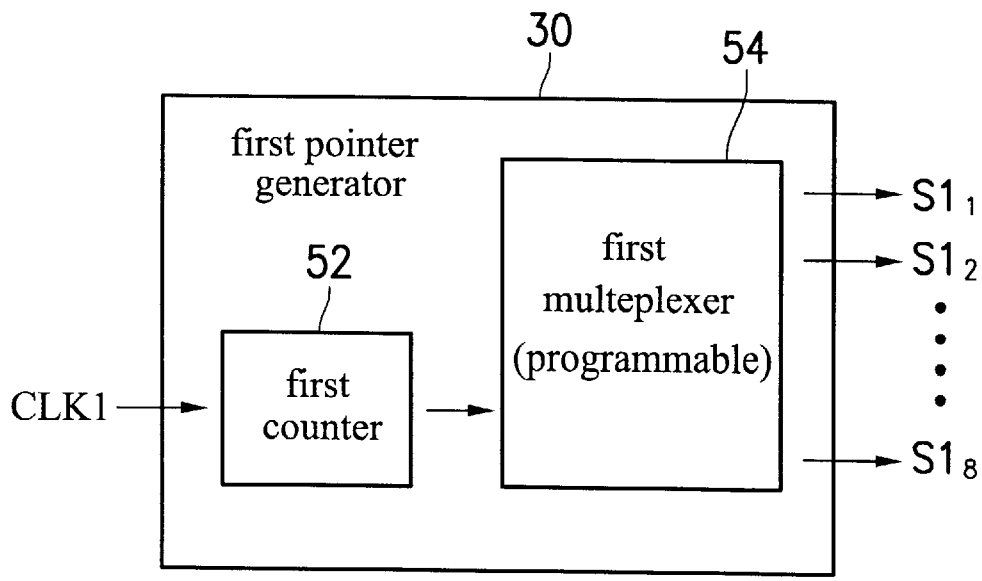

FIGS. 9A and 9B are the diagrams of the original pointer generator and the first pointer generator in FIG. 4, respectively. The original pointer has an original counter 46 and an original multiplexor 48. The original counter 46 generates an original count according to the original clock signal. The original multiplexor 48 selects one of the original memory segments ($SO_1$–$SO_{256}$) relevant to the original count to refresh the cells therein, as shown in FIG. 9A. Similarly, the first pointer 30 has a first counter 52 and a first programmable multiplexor 54. The first counter 52 generates a first count according to the first clock signal. The first multiplexor 54 can be programmed to define some of the original memory segments as the first memory segments, and selects one of the original memory segments ($SO_1$–$SO_{256}$) relevant to the first count to refresh the cells therein as shown in FIG. 9B.

All the functions of programming can be achieved via cutting the fuses on the memory chip by a laser. Around the periphery area, there are many regions without the uppermost metal layer. Thus, the fuses can be placed on open regions, thus not increasing the total silicon area.

The present invention has the following advantages.

1. Improving IC yield rate by utilizing memory cells that would have been classified as failures in the prior art.
2. The power for refresh operations is only slightly increased. Suppose the power for refresh operations due to CLK0 is P0 and the cycle period of CLK1 is four times of that of CLK0, thus the power for refresh operations due to CLK1 (P1) will merely ¼ of P0. Only a small increase in power consumption significantly improves the yield rate.
3. The enlargement of the silicon area is very little. The first clock generator, the first counter and the first multiplexor are employed to process the cells in the first memory segments, which are relatively-small in view of the number of the original memory segments. Therefore, these additional parts don't occupy much silicon area. The cost due to the increased silicon area is minor.

In comparison with the memory refresh structure having only one clock signal in the prior art, the present invention provides a memory refresh structure having two clock signals for the refresh operations. The original clock signal CLK0 takes responsibility for refreshing the cells whose retention times are longer than $T_{retention0}$, as taught in the prior art. The first clock signal CLK1, added by the present invention, takes responsibility for refreshing the cells whose retention times are between $T_{retention1}$ and $T_{retention0}$. Therefore, the yield rate can be improved.

Obviously, more than two clock signals are allowable. For example, the memory refresh structure could be designed to have three clock signals, e.g. CLK0, CKL1 and CKL2. Testers could find out some of the original memory segments having cells having retention times between $T_{retention0}$ and $T_{retention1}$ ($T_{retention1}<T_{retention0}$) and define this portion of the original memory segments as the first memory segments. Second segments would refer to the original memory segments having retention times between $T_{retention1}$ and $T_{retention2}$ ($T_{retention2}<T_{retention1}$). CLK0, CLK1 and CLK2 take responsibility for refresh operations of the original memory segments, the first memory segments and the second segments, respectively.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A memory refresh structure, comprising:
   an original clock generator for periodically generating an original clock signal;
   a first clock generator for periodically generating a first clock signal;
   a memory array composed by a plurality of memory cells which are grouped into a plurality of original memory segments;
   an original segment pointer generator for generating, according to the original clock signal, an original pointer to cyclically select, in a predetermined order, one of the original memory segments and to trigger the refreshing of the memory cells in the selected original memory segment; and
   a first segment pointer generator for one-to-one tagging of the original memory segments as first memory segments and generating, according to the first clock signal, a first pointer to select, in a predetermined order, one of the first memory segments, and to trigger the refreshing of the memory cells in the selected first memory segment;
   wherein an original refresh time interval, defined as the interval of time between refreshes triggered by the original pointer for each of the memory cells in the original memory segments, is longer than a first refresh time interval, defined as the interval of time between refreshes triggered by the first pointer for each of the memory cells in the first memory segments.

2. The memory refresh structure as claimed in claim 1, wherein the first segment pointer generator is programmable to one-to-one tag a portion of the original memory segments as the first memory segments.

3. The memory refresh structure as claimed in claim 1, wherein the memory cells are dynamic random access memories (DRAMs).

4. The memory refresh structure as claimed in claim 1, wherein the first clock generator has a divider that divides the frequency of the original clock signal by a division rate to generate the first clock signal.

5. The memory refresh structure as claimed in claim 4, wherein the divider is programmable to decide the division rate.

6. The memory refresh structure as claimed in claim 1, wherein the original segment pointer generator comprises an original counter for generating an original count according to the original clock signal and an original multiplexor for selecting the selected original memory segments respective to the original number.

7. The memory refresh structure as claimed in claim 1, wherein the first segment pointer generator comprises an first counter for generating a first count according to the first clock signal and a first multiplexor for selecting the selected first memory segments respective to the first number.

8. The memory refresh structure as claimed in claim 7, wherein the first multiplexor is programmable to define the one-to-one relationship between a portion of the original memory segments and the first memory segments.

9. The memory refresh structure as claimed in claim 1, wherein the refreshing triggered by the original pointer is not simultaneous with that triggered by the first pointer.

10. A method for refreshing a memory array, the memory array comprising a plurality of memory cells grouped into a plurality of original memory segments, the memory cells in each of the original memory segments being refreshed simultaneously, a portion of the original memory segments being selected, one-to-one, as first memory segments, each of the first memory segments having at least one memory cell whose data retention time is smaller than an original data retention time, but longer than a first data retention time, the method comprising:

provinding an original clock signal and a first clock signal;

triggering, according to the original clock signal, refreshing operations of the memory cells in the original memory segments to induce an original refresh time for each of the memory cells in the original memory segments shorter than the original data retention time; and triggering, according to the first clock signal, the refreshing of the memory cells in the first memory segments to induce a first refresh time for each of the memory cells in the first memory segments shorter than the first data retention time.

11. The method as claimed in claim 10, wherein the memory cells are dynamic random access memories (DRAMs).

12. The method as claimed in claim 10, wherein the frequency of the original clock signal is integer times larger than that of the first clock signal.

13. The method as claimed in claim 10, wherein the refreshing triggered by the original clock is not simultaneous with that triggered by the first clock.

14. A memory testing method for a memory refresh structure, the memory refresh structure, having:

an original clock generator for periodically generating an original clock signal;

a memory array composed by a plurality of memory cells which are grouped into a plurality of original memory segments; and an original segment pointer generator for triggering, according to the original clock signal, the refreshing of the memory cells in each of the original memory segments and making the refresh time of the memory cells in the original memory segments meet an original data retention time;

the memory testing method comprising:

performing a refresh time testing to retrieve a portion of the original memory segments, each of the retrieved original memory segments having at least one memory cell whose data retention time is longer than a first data retention time but shorter than the original data retention time;

providing a first clock generator for periodically generating a first clock signal; and programming a first segment pointer generator to tag, one-to-one, the retrieved original memory segments as first memory segments and trigger, according to the first clock signal, the refreshing of the memory cells in each of the first memory segments to make the refresh time of the memory cells in the first memory segments meet the first data retention time.

15. The memory testing method as claimed in claim 14, wherein the memory cells are dynamic random access memories (DRAMs).

16. The memory testing method as claimed in claim 14, wherein the firs t clock generator has a divider that divides the frequency of the original clock signal by a division rate to generate the first clock signal.

17. The memory testing method as claimed in claim 14, wherein the divider is programmable to decide the division rate.

18. The memory testing method as claimed in claim 14, wherein the original segment pointer generator comprises an original counter for generating an original number according to the original clock signal and an original multiplexor for selecting one of the original memory segments respective to the original number.

19. The memory testing method as claimed in claim 14, wherein the first segment pointer generator comprises an first counter for generating a first number according to the first clock signal and a first multiplexor for selecting the selected first memory segments respective to the first number.

20. The memory testing method as claimed in claim 14, wherein the programming of the first segment pointer generator excludes the retrieved original memory segments from the original memory segments.

21. The memory testing method as claimed in claim 14, wherein the refreshing of the memory cells in the first memory segments is also triggered by the original segment pointer generator.

22. The memory testing method as claimed in claim 14, wherein the refreshing triggered by the original clock is not simultaneous with that triggered by the first clock.

* * * * *

UNITED STATES PATENT AND TRADEMARK OFFICE
CERTIFICATE OF CORRECTION

PATENT NO.    : 6,366,514 B1
DATED         : April 2, 2002
INVENTOR(S)   : Chien et al.

It is certified that error appears in the above-identified patent and that said Letters Patent is hereby corrected as shown below:

<u>Title page,</u>
Item [*] Notice, delete the phrase "by 210 days" and insert -- by 105 days --

Signed and Sealed this

Twenty-eighth Day of September, 2004

JON W. DUDAS
*Director of the United States Patent and Trademark Office*